United States Patent [19]
Linder et al.

[11] Patent Number: 5,581,213
[45] Date of Patent: Dec. 3, 1996

[54] VARIABLE GAIN AMPLIFIER CIRCUIT

[75] Inventors: Lloyd F. Linder, Agora Hills; Don C. Devendorf, Carlsbad; Bruno W. Garlepp, Pasadena, all of Calif.

[73] Assignee: Hughes Aircraft Company, Los Angeles, Calif.

[21] Appl. No.: 479,284

[22] Filed: Jun. 7, 1995

[51] Int. Cl.$^6$ .................................................... H03G 3/12
[52] U.S. Cl. ............................................ 330/282; 330/86
[58] Field of Search .......................... 330/86, 129, 136, 330/282, 283

[56] References Cited

U.S. PATENT DOCUMENTS

| | | | |
|---|---|---|---|
| 4,755,771 | 7/1988 | Sakaida et al. | 330/282 X |
| 5,077,541 | 12/1991 | Gilbert | 330/284 |
| 5,387,879 | 2/1995 | Satoh | 330/282 |

OTHER PUBLICATIONS

Grebene, *Bipolar and MOS Analog Integrated Circuit Design*, John Wiley & Sons, Inc. 1984, pp. 310–314.

Gilbert, Barrie, *A Low–Noise Wideband Variable–Gain Amplifier Using an Interpolated Ladder Attenuator*, IEEE International Solid–State Circuits Conference (1991), pp. 280–281, 330.

Primary Examiner—Steven Mottola
Attorney, Agent, or Firm—Leonard A. Alkov; Wanda K. Denson-Low

[57] ABSTRACT

A non-attenuating automatic variable gain amplifier (VGA) circuit includes an operational amplifier (op amp) with a feedback resistor connected between its output and inverting input terminals. A variable gain setting resistance circuit having a variable resistance is the gain setting resistor positioned between the op amp's inverting input and a low voltage supply. By varying the resistance of the variable resistance circuit, the gain of the VGA circuit can be manipulated without requiring attenuation of the input signal. A resistance setting control for the variable resistance circuit can operate open loop, fed back from the amplifier output, or fed forward from the amplifier input.

14 Claims, 4 Drawing Sheets

VARIABLE GAIN AMPLIFIER CIRCUIT

BACKGROUND OF THE INVENTION

1. Field of the Invention

This invention relates to variable gain amplifier circuits and more particularly to non-attenuating voltage-controlled automatic variable gain amplifier circuits.

2. Description of the Related Art

Analog signal processing systems often receive input signals with variable amplitudes spread over a wide bandwidth and require that signal's amplitude to be controlled. Variable gain amplifier (VGA) circuits with manual or automatic gain control provide this function. Of particular importance is the VGA circuit's capacity to preserve the whole range of amplitudes received and prevent small input signals from being reduced to the noise level when the input signal has both very high and very low amplitudes.

A number of present VGA circuits are open-loop. A problem with open-loop VGAs is that they do not have the corrective benefits of a feedback system and, thus, are prone to producing high degrees of input to output distortion, especially as their operating temperature rises. Furthermore, there are non-linearities associated with an open-loop circuit which result in a non-linear transfer function between the input and output signals. Also, an open-loop VGA circuit's signal bandwidth is dependent upon the circuit's variable gain, which produces the undesirable result of a variable bandwidth. The power consumed by open-loop VGA circuits can also be high.

Another type of VGA circuit is disclosed in U.S. Pat. No. 5,077,541 to Gilbert, Dec. 31, 1991. The circuit has three basic components: 1) a resistive attenuator, to which the input signal is applied; 2) a circuit to set the attenuation factor o the attenuator to any value within a continuous range of values; and 3) a fixed gain amplifier for receiving the attenuated signal and producing the final output. The attenuator is a ladder network of resistors between the circuit's input voltage and ground. The attenuator is tapped at each ladder step by a gain-control circuit, which comprises a set of current-controllable transconductance ($g_m$) stages, and continuously interpolates between and along the ladder steps (similar to a potentiameter).

A steerable control current sequentially varies the transconductance of each $g_m$ stage in a smoothly changing manner to activate or de-activate the $g_m$ stages in an overlapping sequence. The outputs of each $g_m$ stage are provided at a common node where they are summed and the summed signal is provided as an input to the fixed gain amplifier. The fixed gain amplifier provides the VGA output.

The problem with this type of VGA circuit is that, by initially attenuating the input signal, some smaller signals may be attenuated down to or close to the fixed gain amplifier's input referred noise level. Small input signals will then be lost or significantly corrupted by any noise power and the output will not resemble the input. This is especially troublesome when one input signal dominates the total power in the input signal path.

Another existing amplifier circuit includes the fixed gain feedback operation amplifier (op amp) circuit. This circuit has a fixed value feedback resistor connected between the output of the op amp and its inverting input. A fixed value gain setting resistor is connected between the op amp's inverting input and ground with the signal to be amplified received at the op amp's non-inverting input. The feedback op amp circuit is described in Grebene, *Bipolar and MOS Analog Integrated Circuit Design*, John Wiley & Sons, Inc., 1984, pages 310–314. The fixed gain of the feedback op amp circuit is one plus the ratio of the feedback resistor to the gain setting resistor. A problem with fixed gain amplifier circuits that they are not functional when a variable gain is required.

SUMMARY OF THE INVENTION

The present invention is a novel VGA circuit with a feedback configuration that provides low signal distortion, high bandwidth, high dynamic range, a linear transfer function between input and output signals, and does not attenuate the input signal before amplifying it to produce an output signal.

The new VGA circuit includes an op amp in a feedback loop configuration that receives an input signal at its non-inverting input and provides an output that is an amplified version of its input. A feedback resistor is connected between the op amp's output and inverting input. The novel aspect of the invention is the provision of a variable resistance circuit as the feedback loop's gain setting resistor, between the op amp's inverting input and a low voltage supply, typically ground. By varying the resistance of the variable resistance circuit, the gain of the VGA circuit can be manipulated without requiring attenuation of the input signal.

A preferred variable resistor circuit includes a set of resistors in series between the op amp's inverting input and a low voltage supply, typically ground, to provide fractions of the input voltage at the nodes between the resistors. A control signal causes a selective gain circuit to select the voltages at specific nodes and provide the sum of the selected voltages as an input to a transresistance (TR) amplifier. A resistor is connected between the TR amplifier's output and the op amp's inverting input. As the control signal to the selective gain circuit is varied, the output of the TR amplifier varies. This changes the voltage across the resistor at the TR amplifier's output and the current through that resistor, which in turn varies the current drawn from the op amp's inverting input. The variable resistance circuit thus functions as a variable resistor that sets the output level for the VGA.

The variable resistance circuit's control signal can be manually set at a constant voltage to provide a fixed resistance, and thus a fixed gain for the VGA circuit. Preferably, the control signal is automatically provided by an automatic gain control (AGC) circuit. Two types of AGC circuits that can be used are a feedback AGC which provides a control signal as a function of the VGA output, and a feed-forward AGC which provides a control signal as a function of the VGA's input.

DETAILED DESCRIPTION OF THE INVENTION

Figure 1:
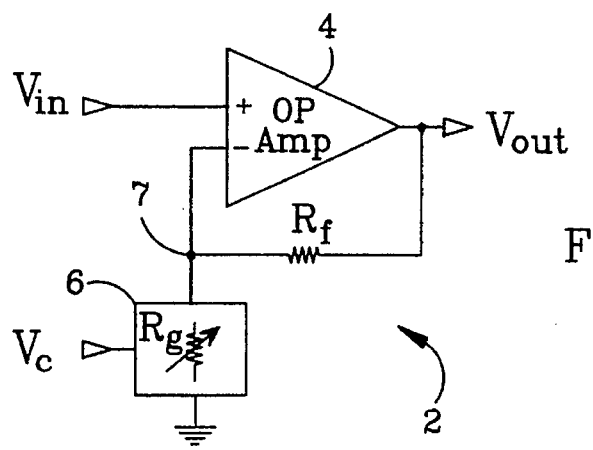
FIG. 1 is a partially block diagram illustrating the basic concept of the new VGA circuit.

FIG. 1 shows the basic concept of the voltage-controlled (VGA) circuit 2 of the present invention. The circuit includes an operational amplifier 4 (op amp) which receives an input signal Vin a its non-inverting input and provides and output signal Vout at its output terminal. Signal amplification is provided in a feedback loop which includes a feedback resistor Rf coupled between the op amp's output and inverting input terminals. The unique aspect of the invention is the provision of a variable resistor circuit 6, whose resistance Rg can be controlled through a control voltage terminal Vc, as a gain setting resistor in the feedback loop between the op amp's inverting input and ground. Rf and the variable resistor circuit 6 are connected at node 7.

As in prior inverting amplifier circuits with a feedback configuration, the voltage gain of the VGA circuit 2 is given by:

$$Vout/Vin = 1 + Rf/Rg$$

By controlling Vc to-vary Rg, the gain of the VGA circuit 2 can be manipulated to provide a desired Vout as Vin changes. Vc may be controlled either automatically as a function of the input or the output levels, or manually by setting it at a fixed value. The variable resistance circuit 6 is described in detail below with reference to FIG. 2 and alternative circuitry for providing automatic control over Vc is described in detail below with reference to FIGS. 3–6.

In the VGA circuit 2 of FIG. 1, since Vin is amplified in a feedback loop, the advantages of negative feedback which include low offset, low distortion between Vout and Vin, and wide bandwidth are realized. These advantages are particularly evident when the VGA circuit 2 receives RF or IF channels carrying multiple signals of unequal power. Furthermore, the VGA circuit 2 never attenuates Vin to later re-amplify it in producing Vout; rather, the gain of the VGA circuit 2 is changed to provide Vout, thus providing actual gain control which prevents distortion of Vin.

The op amp 4 can be either a current controlled amplifier (current amp) or a voltage controlled amplifier (voltage amp). A current amp is preferable because its bandwidth relies predominantly upon the feedback resistance Rg along with the current amp's internal characteristics. Since Rg is fixed, the bandwidth of the VGA circuit 2 can be established at an approximately constant value, independent of gain changes in the feedback loop when a current amp is used. Furthermore, since the benefits of a negative feedback system at a particular signal frequency are determined by the amount of open-loop gain of the op amp 4 at that frequency and the frequencies of the distortion products, it is desirable to use a current amp with a very high open loop gain and very wide bandwidth. Also, to limit distortion of Vin, a linear feedback network which delivers an undistorted sample of the output back to the input is desirable. This requires a highly linear gain setting variable resistor circuit.

The bandwidth of a voltage amp on the other hand is a constant product of the bandwidth and the gain of the feedback loop. The voltage amp's bandwidth would therefore vary with the gain of the VGA circuit 2. Voltage amps are most useful if the range of input frequencies is narrow.

Figure 2:
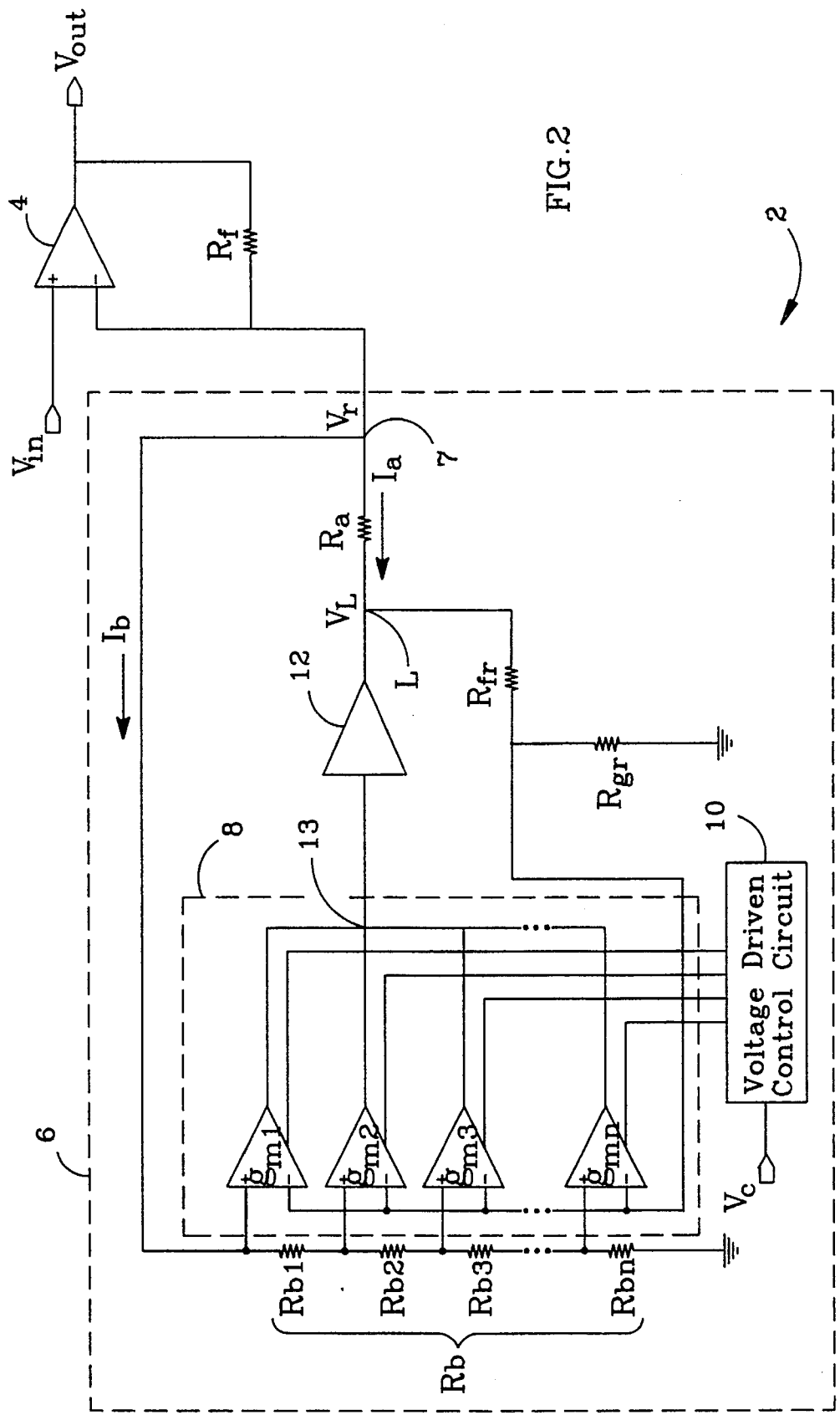
FIG. 2 is a schematic diagram showing details of a preferred implementation variable resistance circuit employed in the VGA of FIG. 1.

FIG. 2 is an expanded schematic diagram of a preferred variable resistance circuit 6 for FIG. 1. The circuit 6 includes a set of series resistors Rb1 to Rbn with a total resistance of Rb, connected between node 7 and a low voltage age supply, typically ground, and a resistor Ra between nodes 7 and another node L within the variable resistance circuit. The voltage Vr, across the variable resistance circuit at node 7 is a function of Vout, Rf and Rg (the resistance of the variable resistance circuit 6 as seen from node 7). The variable resistance circuit 6 further includes several components which function together as a selective gain circuit and are connected in a manner similar to part of a circuit disclosed in U.S. Pat. No. 5,077,541, Gilbert, Dec. 31, 1991. These are a transconductance gain section 8, with several transconductance gain stages $g_{m1}$ to $g_{mn}$, a voltage driven control circuit 10, a transresistance op amp 12 and two fixed value resistors, Rfr and Rgr that, together with the transconductance amplifiers, form a feedback network for the transresistance op amp 12.

The components of the variable resistance circuit 6 that are similar to the Gilbert patent's components are disclosed in that patent as part of a variable gain amplifier circuit. However, in the present invention Gilbert's circuit components are used only as a part of the variable resistance circuit 6 and not as a variable gain amplifier. The successive tap points of the resistors Rb1–Rbn are connected to the non-inverting inputs of the respective $g_m$ stages $g_{m1}$–$g_{mn}$. The outputs of the $g_m$ stages are connected to a common summing node 13, which sums the output currents from the activated g stages and feeds them to the non-inverting input of the transresistance op amp 12. The control circuit 10 determines which of the $g_m$ stages are activated, and the activated stages produce current output signals proportional to their respective input voltages from the resistors that compose Rb. The control circuit 10 thus determines the strength of the signal received at the input of the transresistance op amp 12 and consequently the strength of its output voltage VL at node L. A detailed description of how the $g_m$ stages are activated by the control circuit 10 is provided in the Gilbert patent.

Analyzing the overall operation of the variable resistance circuit 6, for a given voltage Vr (which is proportional to Vout) at node 7, a current Ib=Vr/Rb flows from node 7 through Rb to ground. Ib sets up the tap voltages between successive resistors Rb1–Rbn. Since Rb1–Rbn are fixed value linear resistors, the voltages at each step of Rb remain as fractions of Vr as long as the $g_m$ stages sink or supply only a negligible amount of current (as is actually the case). The control circuit determines which $g_m$ stages are active and to what extent they are active. The active $g_m$ stages in turn provide signals to the summing node 13 for amplification by the transresistance op amp 12. The gain factor of the transresistance op amp 12 is determined by resistors Rfr and Rgr, which set up a feedback loop from the transresistance op amp's output at node L to each $g_m$ stage. VL is therefore equal to a fraction of Vr selected by the $g_m$ stages, multiplied by (1+Rfr/Rgr). For example, if four equal resistors, Rb1, Rb2, Rb3 and Rb4, make up Rb, and $g_m$ stage 2 is selected, then the fraction of Vr selected is Vr * (Rb2+Rb3+Rb4)/(Rb1+Rb2+Rb3+Rb4) which equals Vr * (¾). Vr * (¾) is then multiplied (amplified) by (1+Rfr/Rgr) to produce VL.

The effective resistance Rg of the variable resistance circuit 6 is equal to Vr divided by the current flowing into node 7, which is Ia plus Ib. Ib is the current through Rb (which is equal to Vr/Rb), and Ia is the current through Ra (which is equal to (Vr-VL)/Ra). Assuming Vc is constant, the number of $g_m$ stages turned on is constant. Thus, if Vr is increased, Ib also increases, which in turn increases the voltages tapped by the $g_m$ stages to produce an increase in VL. The resultant difference between Vr and VL in turn establishes Ia. The analysis below establishes that both Ia and Ib vary as constant multiples of Vr, so that the variable resistance circuit 6 provides an effective variable resistance Rg.

Still assuming that Vc is constant, Vr will be amplified by a constant factor K, provided by the selected $g_m$ stages and the transresistance op amp 12, to establish VL (VL=K*Vr). Ia will therefore be:

$$Ia = \frac{Vr - VL}{Ra} = \frac{Vr - (K*Vr)}{Ra}$$

$$Ia = Vr\left(\frac{1-K}{Ra}\right)$$

Ia is thus a constant multiple (Ra/(1-K)) of Vr for a constant Vc. Also, since Ib is a constant multiple (Rb) of Vr, Rg is effectively equal to the resistance of two resistors in parallel at node 7. One resistor is Rb from node 7 to ground, and the second resistor has a resistance of Ra/(1-K) between node 7 and node L. Rg is thus dependent upon K, which can be less than one, equal to one or more than one. If K is less than one, the resistance between nodes 7 and L is greater than Ra and Ia flows from node 7 to node L. If K equals one, there is effectively an open circuit between nodes 7 and L and Ia equals zero. If K is greater than one, then there is a negative resistance which means that Ia flows from node L to node 7.

The equations below provide a quantitative analysis for establishing the value of Rg.

$$Rg = \frac{Vr}{Ia + Ib}$$

$$Ia = \frac{Vr - VL}{Ra} \quad Ib = \frac{Vr}{Rb}$$

$$Rg = \frac{Vr}{\frac{Vr - VL}{Ra} + \frac{Vr}{Rb}}$$

Since $VL/Vr = K$ $$Rg = \frac{1}{\frac{1-K}{Ra} + \frac{1}{Rb}}$$

Thus, Rg is a function of K, Rb and Ra, making it possible to design for a large range of Rg values. The lower limit of Rg is restricted by the amount of current through Ra that the transresistance amplifier 12 can sink or source by varying VL. The upper limit of Rg is determined by the highest Rb value that can be used without suffering significant loading by the bias currents into the $g_m$ stages along Rb.

Although it was assumed that Vc is constant in establishing Rg, the same analysis as above applies if Vc is varying. The reason is that Vc varies by increments and, at each increment, it can be assumed that Vc is constant. Thus, Rg also varies by increments and can be evaluated according to the above analysis.

One degree of flexibility provided by the VGA circuit 2 is its capacity to limit non-linearities between the control voltage Vc and the gain transfer function of VGA circuit 2. The non-linearity between Vc and the VGA gain is predominantly due to the non-linear transition from one $g_m$ stage to the next. This non-linearity, however, can be made arbitrarily small by adding $g_m$ stages and breaking Rb into a larger number of resistors, and therefore spanning smaller increments of gain change for each successive $g_m$ stage that is activated or deactivated. By varying the resistance values of Rb1-Rbn to tailor the fraction of Vr tapped by each $g_m$ stage, the ratio of the control voltage to the VGA gain transfer function can be made linear to logarithmic, linear to linear, or virtually any other singular or monotonic function.

The VGA circuit 2 can provide two different types of outputs Vout. One type of Vout is a constant gain version of Vin with the amplitude of Vout varying as Vin's amplitude varies. This application would be useful if, for example, Vin is a speech signal which requires amplitude variation for comprehension. To produce a constant gain, a constant Vc is established, which in turn produces a constant Rg and a constant amplification by the VGA circuit 2. Circuitry in addition to the circuitry of FIG. 2 is not required to establish a constant Vc. All that is required is a reference voltage to be applied at Vc. The second type of Vout is a constant amplitude signal, automatically controlled even as Vin changes. An example of this application is the output of a radio, which should remain constant even though the input signal may be variable in amplitude. This type of circuit requires additional circuitry beyond the VGA circuit 2 and is described below in reference to FIGS. 3-4 and FIGS. 5-6.

Figure 3:
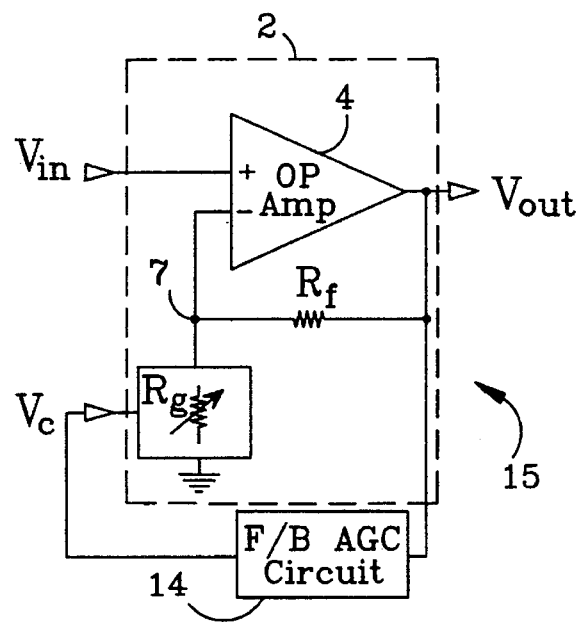
FIG. 3 is a partially block diagram illustrating the invention with a feedback AGC circuit.
Figure 4:
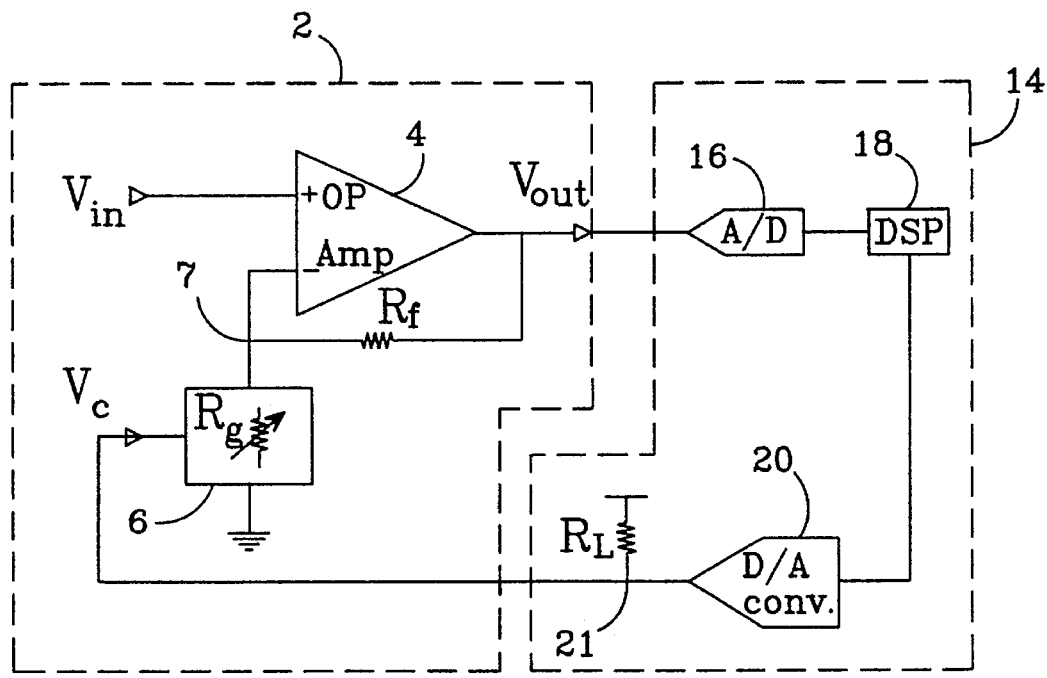
FIG. 4 is a schematic diagram showing the details of a preferred implementation for the AGC circuit of FIG. 3.

FIG. 3 is a schematic block diagram of an automatic VGA circuit 15 in which a feedback automatic gain control (F/B AGC) circuit 14 is added to the basic VGA circuit 2 to establish Vc as a function of Vout. The purpose of the F/B AGC circuit 14 is to test Vout and determine if it is at a desired level. If Vout is not at the desired level, the gain of the VGA circuit is varied to produce the desired Vout. The F/B AGC circuit 14 has many possible implementations, one of which is shown in FIG. 4. In the automatic VGA circuit 15 of FIG. 4, Vout is digitized by an analog-to-digital converter (A/D) 16 and provided to a digital signal processor (DSP) 18. The DSP analyses the A/D signal amplitude to determine if Vout is at a desired predetermined level. If the A/D signal amplitude is not at the predetermined level (i.e. too high or too low), the DSP sends a corrective digital signal to a digital-to-analog converter (D/A) 20. The D/A converter 20 converts the DSP corrective signal into Vc, which corrects the gain of the VGA circuit 2. A resistor, RL, is connected from the output of D/A converter 20 at node 21 to a reference voltage, typically ground. RL is provided for a D/A converter that produces a current output. If the D/A converter produces a voltage output, RL is not necessary. The circuit continuously monitors Vout to determine if Vc and the gain need to be corrected, and is thus an automatic VGA circuit 15.

Figure 5:
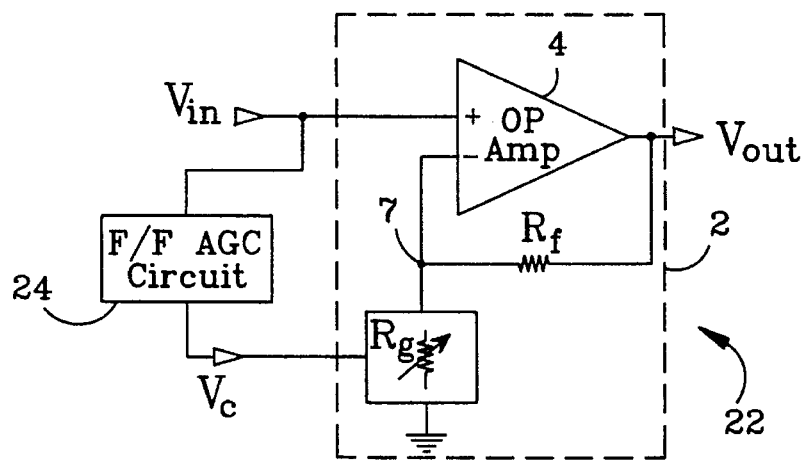
FIG. 5 is a partially block diagram illustrating the invention with a feed-forward AGC circuit.
Figure 6:
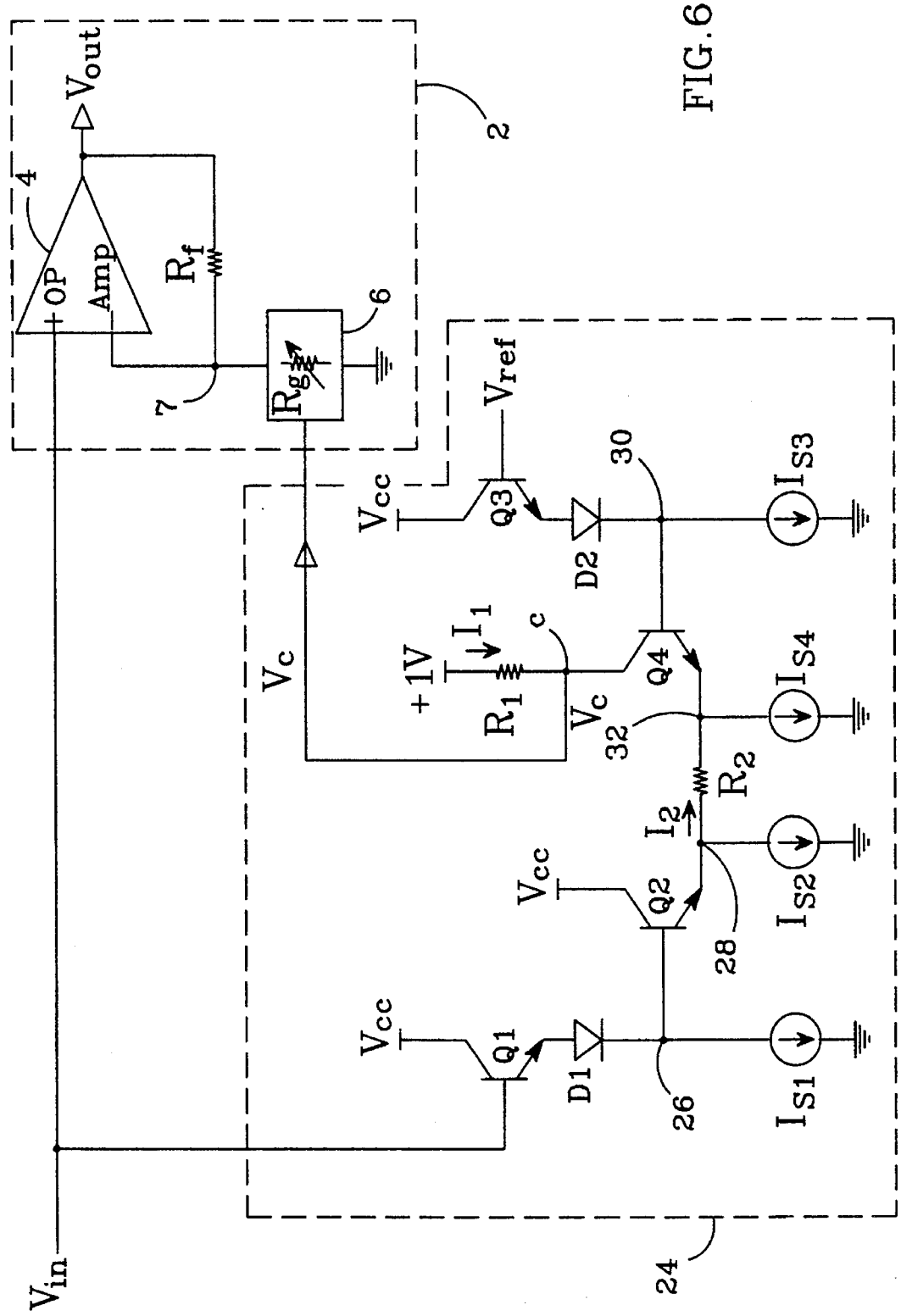
FIG. 6 is a schematic diagram showing the details of a preferred implementation for the AGC circuit of FIG. 5.

FIG. 5 is a schematic block diagram of another automatic VGA circuit 22 which includes the VGA circuit 2 with the addition of a feed-forward automatic gain control (F/F AGC) circuit 24 that establishes Vc as a function of Vin. The F/F AGC circuit 24 has many possible implementations, one of which is shown in FIG. 6. The overall function of the F/F AGC circuit 24 of FIG. 6 is to compare Vin to a predetermined reference voltage Vref and establish Vc according to their difference. The VGA circuit 2 gain is therefore corrected as a function of Vin to keep a constant Vout.

Referring to FIG. 6, the F/F AGC circuit 24 has first and second reference circuits connected together by a resistor R2. The first reference circuit is to the left of R2 and the second reference circuit is to the right of R2. The first reference circuit receives Vin at the base of a bipolar transistor Q1 which is connected through its emitter to the anode of a diode D1 and through its collector to the power supply VCC. A current source Is1 is connected between the cathode of D1 and ground and supplies current to keep D1 on. The voltage at the D1/Is1 junction node 26 is, therefore, Vin less approximately two diode drops. D1 is conventionally implemented as a bipolar transistor with its base and collector connected together. The base of a second bipolar transistor Q2 receives the voltage at node 26, thus producing a voltage of Vin less approximately three diode drops at its emitter node 28. The collector of Q2 is connected to the power supply VCC. Current source Is2 between node 28 and ground provides current to keep Q2 on.

The second reference circuit, shown to the right of R2, receives Vref at the base of a bipolar transistor Q3 which is connected through its emitter to the anode of a diode D2, and through its collector to the power supply VCC. A current source Is3 is connected between the cathode of D2 and ground and supplies current to keep D2 on. The voltage at the node 30 to which the cathode of D2 is connected is, therefore, Vref less approximately two diode drops. The base of another bipolar transistor Q4 receives the voltage at node 30, thus producing a voltage of Vref less approximately three diode drops at its emitter, which is connected to a node 32. The collector of Q4 is connected to a node c and resistor R1 is connected from node c to a plus one volt supply. A current source Is4 is connected between node 32 and ground and provides current to keep Q4 on.

From the above analysis, it can be seen that the voltage difference between nodes 28 and 32 is Vin minus Vref. This establishes a current I2 through R2. The voltage difference across R1, on the other hand, is plus one volt minus Vc (the voltage at node c). Since Is4 is constant, I1 plus I2 is constant. Therefore, as Vin changes the voltage across R1, and thus, also I1, change. This in turn causes I2 and the voltage across R2 to change, which alters the voltage at node c and thus Vc. The value of Vc establishes Rg and the gain of the VGA circuit 2 as described above.

The table below provides an example of the relationship between Vin, Vc and the resulting gain of VGA circuit 2 (G) if Vref is 0.25V, R1 is 750 ohms, R2 is 1.5 kilo ohms, Is2 and Is4 are both 1 milliamp and a Vout of 10.0 V is desired.

| VIN | Vc | G | Vout |
| --- | --- | --- | --- |
| 0.25V | −0.5V | 40 | 10.0 V |
| 0.5 V | 0.0 | 20 | 10.0 V |
| 1.0 V | 1.0V | 10 | 10.0 V |

Figure 7:
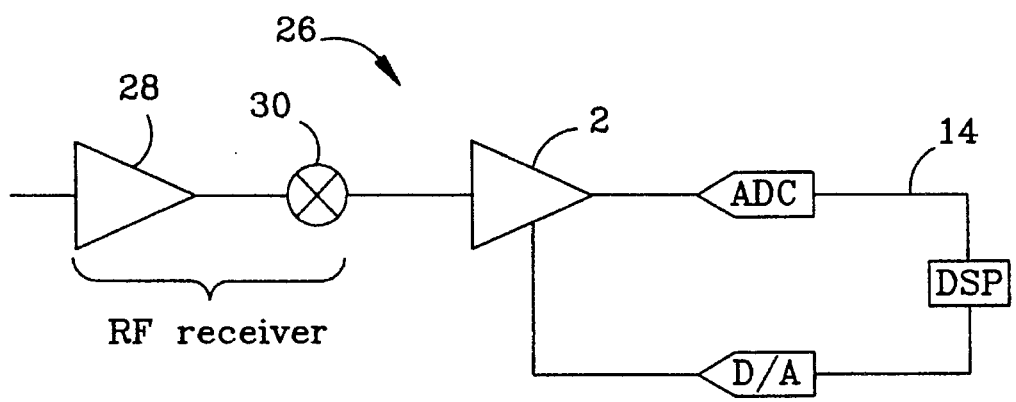
FIG. 7 is a block diagram illustrating a telecommunications system employing the present invention VGA with a feedback AGC circuit.

FIG. 7 is an illustration of a telecommunications system 26 in which the VGA circuit 2 is used. The system includes a radio frequency (RF) receiver with an antenna 28 for receiving a signal that is in the cellular frequency range. The signal is converted to a lower frequency range by a mixer 30 which provides the input to the VGA circuit. The feedback automatic gain control circuit 14 described above provides the desired gain control.

While particular embodiments of the invention have been shown and described, numerous alternate embodiments will occur to those skilled in the art. For example, different variable resistor circuits such as other voltage controlled or current controlled variable resistors, thermistors or PIN diodes could be used instead of the particular variable resistor circuit 6 shown in FIG. 2. Furthermore, different feedback and feed-forward AGC circuits than those described in FIGS. 4 and 6 above could be used. Accordingly, it is intended that the invention be limited only in terms of the appended claims.

We claim:

1. A non-attenuating variable gain amplifier (VGA) circuit for receiving an input signal and a control signal and producing an amplified version of its input signal as an output signal, comprising:

an operational amplifier (op amp) having a non-inverting input terminal for receiving said VGA circuit input signal, an output terminal for providing said VGA output signal, and an inverting input terminal, a feedback resistor coupled between the inverting input and the output terminal of said op amp, and a variable resistance circuit connected between the inverting input of said op amp and a low power node, and having a control signal terminal for receiving said control signal to establish said variable resistance circuit's resistance and he gain of said amplifier circuit, wherein said variable resistance circuit comprises:

(i) a plurality of resistors in series connected to receive the voltage at the non-inverting input terminal of said op amp and to produce fractions of said non-inverting input voltage at nodes between said resistors, (ii) a gain select circuit for receiving the voltages at said nodes and producing an output signal by amplifying select node voltages, with the selected node voltages determined by said control signal, and (iii) a resistor between said inverting op amp input terminal and said gain select circuit output, the current through said resistor and the effective resistance of said variable resistance circuit varying as said gain select circuit output signal is varied.

2. A non-attenuating VGA circuit as in claim 1, further comprising:

an automatic gain control circuit having an input connected to receive an input signal and providing said control signal as a function of its input signal.

3. A non-attenuating VGA circuit as in claim 2, wherein the input of said automatic gain control circuit is connected to receive said VGA circuit output signal.

4. A non-attenuating VGA circuit as in claim 3, wherein said automatic gain control circuit comprises:

an analog-to-digital (A/D) converter connected to receive said VGA circuit output and producing a digitized output signal proportional to said VGA circuit output, a digital signal processor (DSP) connected to receive said digitized output signal and producing a corrective digital output signal if the amplitude of said A/D converter output signal is not at a predetermined setting, and a digital-to-analog (D/A) converter connected to receive said DSP corrective output signal and convert it to said control signal.

5. A non-attenuating VGA circuit as in claim 2, wherein the input of said automatic gain control circuit is connected to receive said VGA circuit input signal.

6. A non-attenuating VGA circuit as in claim 5, wherein said automatic gain control circuit comprises:

a pair of voltage reference circuits that establish a voltage differential equal to the voltage at said VGA circuit input less a predetermined reference voltage, and a resistor connected between said voltage reference circuits to receive said voltage differential, and to support a current flow that establishes said control signal.

7. A non-attenuating VGA circuit as in claim 1, wherein said op amp is a current controlled operational amplifier.

8. A non-attenuating VGA circuit as in claim 1, wherein said op amp is a voltage controlled operational amplifier.

9. A variable resistance circuit which provides an effective variable resistance at a first node, said variable resistance being controlled by the level of a control signal received by said variable resistance circuit, comprising:

a first resistor connected between said first node and a fixed low power node wherein said first resistor comprises a plurality of resistors in series to produce fractions of the voltage at said first node at the nodes between said resistors comprising said first resistor, a second node which receives a voltage that is a constant function of the voltage at said first node, a second resistor connected between said first and second nodes, and a gain select circuit for receiving the voltages at the nodes between said resistors comprising said first resistor and producing the voltage at said second node by amplifying a select node voltages, with the selected node voltages determined by said control signal.

10. A variable resistance circuit as in claim 9, wherein the voltage at said second node is established by said control signal.

11. A variable resistance circuit which provides an effective variable resistance at a first node with a constant voltage, said variable resistance being controlled by the level of a control signal received by said variable resistance circuit, comprising:

a first resistor connected to said first node and supporting a constant current wherein said first resistor is connected between said first node and a low power node and wherein said first resistor comprises a plurality of resistors in series to produce fractions of the voltage at said first node at the nodes between said resistors comprising said first resistor, a second resistor connected to said first node and supporting a variable current which varies according to the level of said control signal, a second node having a voltage that is a constant function of the voltage at said first node, and said second resistor being connected between said first and second nodes and wherein the voltage at said second node is established by the level of said control signal, and a gain select circuit for receiving the voltages at the nodes between said resistors comprising said first resistor and producing the voltage at said second node by amplifying select node voltages, with the selected node voltages determined by said control signal.

12. A non-attenuating variable gain amplifier (VGA) circuit for receiving an input signal and a control signal and producing an amplified version of its input signal as an output signal, comprising:

an operational amplifier (op amp) having a non-inverting input terminal for receiving said VGA circuit input signal, an output terminal for providing said VGA output signal, and an inverting input terminal, a feedback resistor coupled between the inverting input and the output terminal of said op amp, a variable resistance circuit connected between the inverting input of said op amp and a low power node, and having a control signal terminal for receiving said control signal to establish said variable resistance circuit's resistance and the gain of said amplifier circuit, and an automatic gain control circuit having an input connected to receive an input signal and providing said control signal as a function of its input signal, wherein the input of said automatic gain control circuit is connected to receive said VGA circuit output signal.

13. A non-attenuating VGA circuit as in claim 12, wherein said automatic gain control circuit comprises:

an analog-to-digital (A/D) converter connected to receive said VGA circuit output and producing a digitized output signal proportional to said VGA circuit output, a digital signal processor (DSP) connected to receive said digitized output signal and producing a corrective digital output signal if the amplitude of said A/D converter output signal is not at a predetermined setting, and a digital-to-analog (D/A) converter connected to receive said DSP corrective output signal and convert it to said control signal.

14. A non-attenuating variable gain amplifier (VGA) circuit for receiving an input signal and a control signal and producing an amplified version of its input signal as an output signal, comprising:

an operational amplifier (op amp) having a non-inverting input terminal for receiving said VGA circuit input signal, an output terminal for providing said VGA output signal, and an inverting input terminal, a feedback resistor coupled between the inverting input and the output terminals of said op amp, a variable resistance circuit connected between the inverting input of said op amp and a low power node, and having a control signal terminal for receiving said control signal to establish said variable resistance circuit's resistance and the gain of said amplifier circuit, and an automatic gain control circuit having an input connected to receive an input signal and providing said control signal as a function of its input signal, wherein the input of said automatic gain control circuit is connected to receive said VGA circuit input signal, and further, wherein said automatic gain control circuit comprises:

(i) a pair of voltage reference circuits that establish a voltage differential equal to the voltage at said VGA circuit input less a predetermined reference voltage, and (ii) a resistor connected between said voltage reference circuits to receive said voltage differential, and to support a current flow that establishes said control signal.

* * * * *